United States Patent
Nogome

(10) Patent No.: US 6,218,685 B1
(45) Date of Patent: Apr. 17, 2001

(54) SEMICONDUCTOR DEVICE AND METHOD FOR FABRICATING THE SAME

(75) Inventor: Masanobu Nogome, Bizen (JP)

(73) Assignee: Matsushita Electronics Corporation, Osaka (JP)

( * ) Notice: Subject to any disclaimer, the term of this patent is extended or adjusted under 35 U.S.C. 154(b) by 0 days.

(21) Appl. No.: 09/226,415

(22) Filed: Jan. 6, 1999

(30) Foreign Application Priority Data

Jan. 8, 1998 (JP) .................................................. 10-002291

(51) Int. Cl.[7] .................... H01L 31/072; H01L 31/109; H01L 31/0328; H01L 31/0336
(52) U.S. Cl. .................. 257/192; 257/194; 257/195; 257/507; 257/622; 438/167; 438/421
(58) Field of Search ...................................... 257/195, 194, 257/192, 507, 622; 438/167, 421

(56) References Cited

U.S. PATENT DOCUMENTS 5,514,605  5/1996  Asai et al. ............................. 437/40
6,091,078 * 7/2000  Codama ................................ 257/40

FOREIGN PATENT DOCUMENTS

| | | |
|---|---|---|
| 60-231368 | 11/1985 | (JP) . |
| 63-52482 | 3/1988 | (JP) . |
| 2-49465 | 2/1990 | (JP) . |
| 2-69943 | 3/1990 | (JP) . |
| 2-98946 | 4/1990 | (JP) . |
| 5-129272 | 5/1993 | (JP) . |
| 5-275474 | 10/1993 | (JP) . |
| 8-17788 | 1/1996 | (JP) . |

* cited by examiner

Primary Examiner—William Mintel
(74) Attorney, Agent, or Firm—Ratner & Prestia

(57) ABSTRACT

A semiconductor device includes two or more semiconductor elements provided on a semi-insulating substrate with a buffer layer and an interlevel film being interposed therebetween, an element isolating portion provided as a result of forming a groove between the two or more semiconductor elements through the buffer layer and the interlevel film so as to reach the semi-insulating substrate, and a protective film for protecting at least ends of the buffer layer in the vicinity of the element isolating portion.

3 Claims, 7 Drawing Sheets

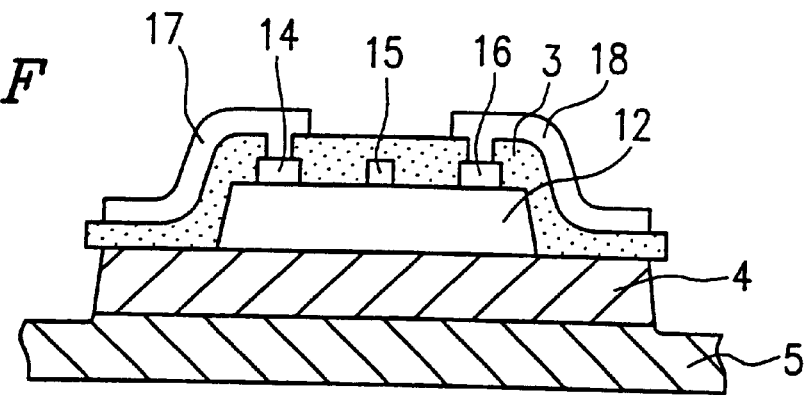
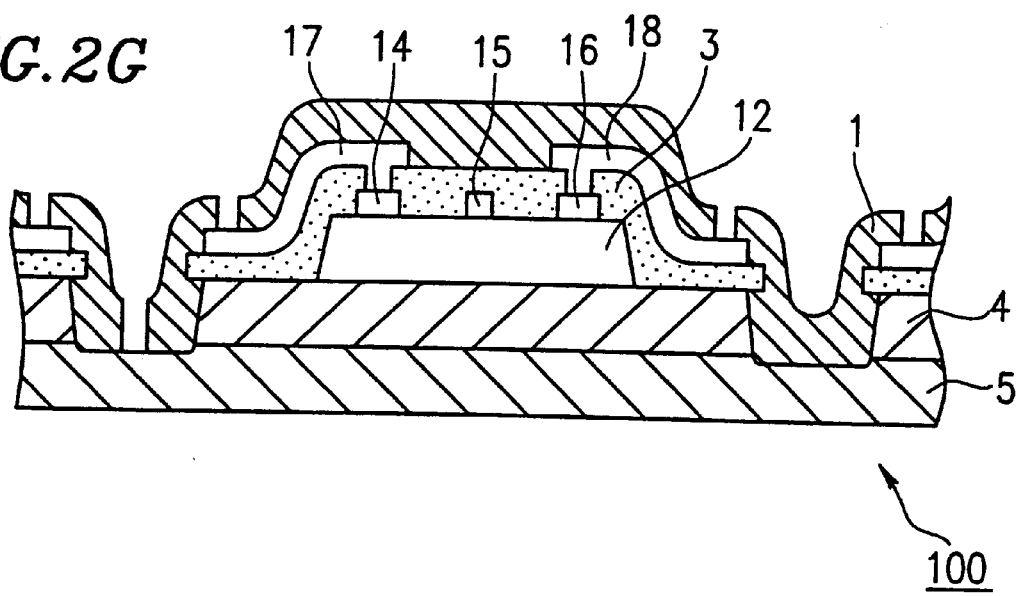

FIG. 3
(A1) 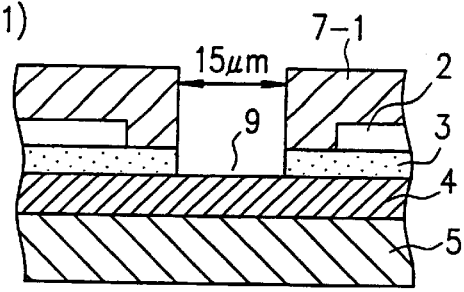
(B1) 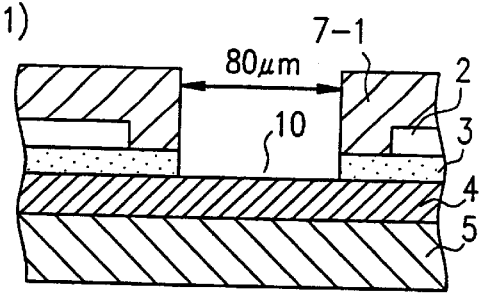
(A2) 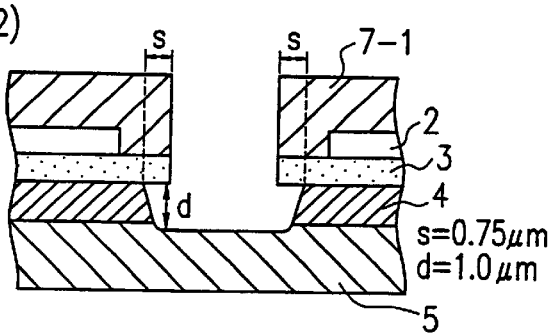
(B2) 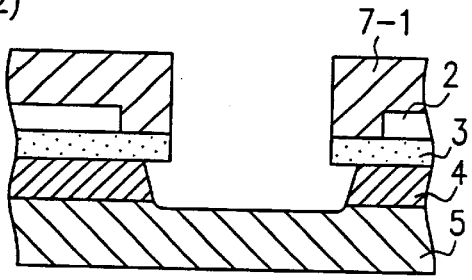
(A3) 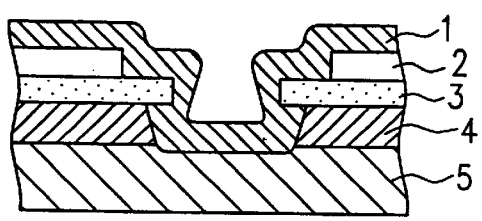
(B3) 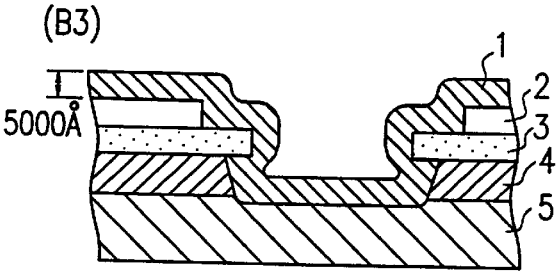
(A4) 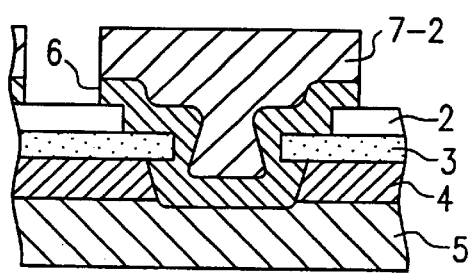
(B4) 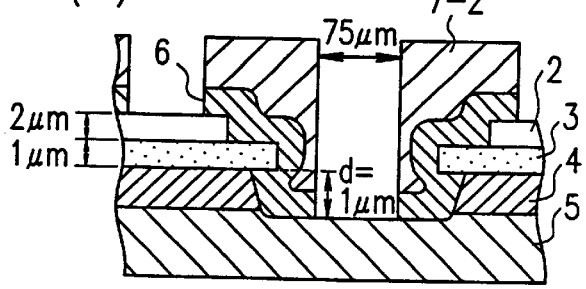
(A5) 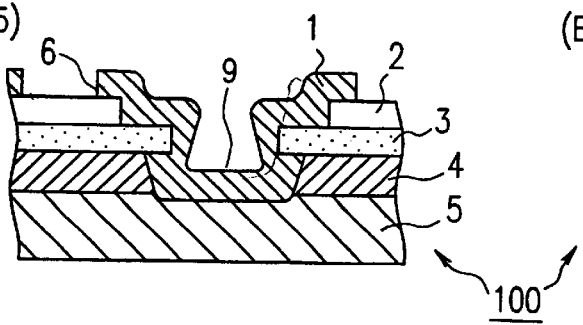
(B5) 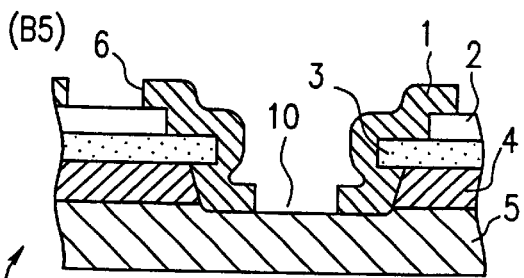

SEMICONDUCTOR DEVICE AND METHOD FOR FABRICATING THE SAME

BACKGROUND OF THE INVENTION

1. Field of the Invention

The present invention relates to a semiconductor device and a method for fabricating the same, and more specifically, to a semiconductor device and a method for fabricating an element isolating portion between two or more field effect transistors (FETs) which are semiconductor elements formed on a semi-insulating substrate.

2. Description of the Related Art

A compound semiconductor FET made of a compound such as GaAs or the like is widely used for both digital and analog integrated circuits. Since a compound semiconductor such as GaAs or the like has a higher electron mobility than that of a Si semiconductor, the compound semiconductor FET has an advantage of having a high operation speed suitable for a device which operates in the range from a microwave to a millimeter wave and a high output device. Furthermore, in the case where a compound semiconductor such as GaAs or the like is used as a material of a semi-insulating substrate, the compound semiconductor FET has an advantage of realizing a lower parasitic capacitance than that obtained when using Si as a material of the substrate, and thus reducing an influence on the device.

One example of integrated circuits using a compound semiconductor is a chip used as an amplifier incorporated in a portable phone. Usually, two or more FETs are used in one chip in order to obtain an amplified voltage at a high efficiency and at a high output level. In this chip, a scribe line portion is provided as a result of subscribing a semi-insulating substrate so as to surround the FETs. Moreover, an element isolating portion is provided between the FETs which are placed apart from one another. The element isolating portion is required in order to prevent an interference and an oscillation occurring between FETS. Japanese Laid-Open Publication No. 5-275474, for example, proposes forming a groove reaching a semi-insulating substrate from a surface of a chip between two adjacent FETs.

Hereinafter, an element isolating portion and a scribe line portion of a conventional semiconductor device 600, and a method for forming the portions will be described with reference to FIG. 6.

FIG. 6 shows cross-sectional views illustrating steps of a method for forming an element isolating portion 69 and a scribe line portion 70 of the conventional semiconductor device 600. In FIG. 6, parts A1 to A5 show steps of forming the element isolating portion 69, and parts B1 to B5 show steps of forming the scribe line portion 70. Parts A1, A2, A3, A4 and A5 and parts B1, B2, B3, B4 and B5 show corresponding steps, respectively.

As shown in parts A5 and B5 in FIG. 6, the conventional semiconductor device 600 includes a semi-insulating substrate 65; a buffer layer 64 provided on the semi-insulating substrate 65; an interlevel film 63 provided on the buffer layer 64; an electrode 62 provided on the interlevel film 63; and a protective film 61 provided on the buffer layer 64 covering ends of the electrode 62 and the interlevel film 63, and formed so that a top surface of the electrode 62 is partially exposed so as to form electrode windows 66. The semi-insulating substrate 65 is made of GaAs, and the buffer layer 64 includes an undoped GaAs film (thickness: 5000 Å), an undoped $Al_{0.2}Ga_{0.8}As$ film (thickness: 2000 Å), and an undoped GaAs film (thickness: 1000 Å) sequentially provided in this order from the bottom. The interlevel film 63 includes an upper layer made of SiN having a thickness of 5000 Å and a lower layer made of $SiO_2$ having a thickness of 5000 Å. The electrode 62 is made of Au, and the protective film 61 is made of SiN having a thickness of 5000 Å. As shown in part A5 in FIG. 6, the semiconductor device 600 has the element isolating portion 69 penetrating the buffer layer 64 and reaching an inside of the semi-insulating substrate 65. In the vicinity of the element isolating portion 69, the buffer layer 64 and the semi-insulating substrate 65 are exposed to outside air. Furthermore, as shown in part B5 in FIG. 6, the protective film 61 is partially disconnected on the buffer layer 64 so as to form the scribe line portion 70. In the vicinity of the scribe line portion 70, the buffer layer 64 is exposed to outside air.

The buffer layer 64 has a function of reducing a current leakage to the substrate 65 through a channel. The interlevel film 63 inactivates the surface of the buffer layer 64 so as to obtain the stability thereof, and prevents the buffer layer 64 from adsorbing molecules in the air.

Hereinafter, a conventional method for fabricating the semiconductor device 600 having the element isolating portion 69 and the scribe line portion 70 will be described in detail.

It should be noted that the conventional method for fabricating FETs will not be shown in drawings because it is known to those skilled in the art.

After forming the metal layers for a gate, a source and a drain on the active layer, the interlevel film 63 is formed so as to cover an active layer on the buffer layer 64. Subsequently, a contact hole is formed in the interlevel film 63 so as to reach the metal layer. Then, the electrode 62 is formed on the interlevel film 63 so as to fill the contact hole, thereby forming a FET. Any appropriate method can be employed in fabricating the FETs.

Then, a first resist layer 68-1 (parts A1 and B1 of FIG. 6) used for etching the interlevel film 63 is formed in a dark room by a resist coater. The first resist layer 68-1 has an opening having a width of 90 µm at a position where the element isolating portion 69 will be formed and an opening having a width of 80 µm at a position where the scribe line portion 70 will be formed.

Next, the interlevel film 63 including the SiN (upper) layer and the $SiO_2$ (lower) layer is etched, as shown in parts A1 and B1 in FIG. 6, at positions where the element isolating portion 69 and the scribe line portion 70 will be formed. In this step, the SiN layer is etched by dry etching with $CF_4$, and subsequently, the $SiO_2$ layer is etched by wet etching with hydrofluoric acid. Then, the first resist layer 68-1 is removed by a resist remover. Thereafter, as shown in parts A2 and B2 in FIG. 6, a SiN layer is grown by plasma CVD on the buffer layer 64 covering the interlevel film 63 and the electrode 62 so as to form the protective film 61 having a thickness of 5000Å.

Subsequently, as shown in parts A3 and B3 in FIG. 6, a second resist layer 68-2 used for forming the electrode windows 66 functioning as a gate, a source and a drain of the FET on the Au electrode 62 is formed on the protective film 61 by a resist coater in a dark room. The second resist layer 68-2 has openings at positions where the electrode windows 66, the element isolating portion 69 and the scribe line portion 70 will be later formed. Next, still referring to parts A3 and B3 in FIG. 6, the protective film 61 is etched by dry etching with $CF_4$ using the second resist layer 68-2 as a mask in order to form openings at positions where the element isolating portion 69 and the scribe line portion 70 will be formed. The second resist layer 68-2 has an opening having a width of 85 μm at a position where the element isolating portion 69 will be formed and an opening having a width of 75 μm at a position where the scribe line portion 70 will be formed. The width of each opening of the second resist layer 68-2 is slightly smaller than that of the first resist 68-1 because the protective film 61 needs to cover the interlevel film 63.

After removing the second resist layer 68-2 by a resist remover, a third resist layer 68-3 (part A4 and B4 in FIG. 6) used for forming the element isolating portion 69 is formed by a resist coater in a dark room. The third resist layer 68-3 has an opening having a width of 15 μm at a position where the element isolating portion 69 will be formed. The resultant laminate is etched for about 10 minutes by wet etching using an etchant having a volume ratio of phosphoric acid to hydrogen peroxide to water of 4:1:5. As a result, a groove running from a top surface of the buffer layer 64 to an inside of the semi-insulating substrate 65 is formed. The groove has a depth "d" *of as much as about* 20 μm.

In the case where the etching is not performed sufficiently deep to reach the inside of the semi-insulating substrate 65, the following problems occur. Since surfaces 64a of the buffer layer 64 facing a position where the element isolating portion 69 will be formed is exposed to outside air, impurities adsorbed on the surfaces 64a of the buffer layer 64 cause a current leakage between the FETs. In addition, the surface of the buffer layer 64 is oxidized due to a contact with outside air, resulting in causing a current leakage between the FETs. Therefore, in order to reduce the current leakage and improve electric characteristics of the chip, the etching is performed through the buffer layer 64 deep into the semi-insulating substrate 65 as described above.

Moreover, since wet etching is used in the etching step, the etching is performed not only along a direction perpendicular to but along to a direction horizontal to the semi-insulating substrate 65. Therefore, the buffer layer 64 is etched along the direction horizontal to the substrate 65 (i.e., side etching is performed) by a distance of as much as about 15 μm as indicated by letter "s" in part A4 in FIG. 6, which is substantially equal to the width of the opening of the third resist layer 68-3.

Lastly, as shown in parts A5 and B5 in FIG. 6, the third resist layer 68-3 is removed by a resist remover. As a result, the semiconductor device 600 having the element isolating portion 69 and the scribe line portion 70 is produced.

The method for fabricating the conventional semiconductor device as described above requires three steps of forming resist layers in a dark room until an element isolating portion is formed between the FETs in the case where two or more FETs (semiconductor elements) are formed in one chip. Therefore, the conventional method requires many steps.

In the chip fabricated in the conventional method, surfaces of the components defining the element isolating portion and the scribe line portion are exposed to outside air. AlGaAs used for making the buffer layer of the chip is likely to adsorb impurities in the air, and so is easily oxidized. Therefore, when the buffer layer is put into contact with outside air, AlGaAs is oxidized on the exposed surface of the buffer layer so that a current leaks to a channel region through the buffer layer.

Furthermore, the chip fabricated in the conventional method as described above has a groove having a depth of about 20 μm and running deep inside of the semi-insulating substrate, the groove being formed as a result of etching. The groove is formed in order to reduce the current leakage due to impurities and oxidation of the surface of the buffer layer and to improve electric characteristics of the chip. As described above with reference to part A4 in FIG. 6, however, the etching causes side etching in both horizontal directions from the element isolating portion (2s=about 30 μm). Therefore, in the conventional method, the width of the element isolating portion between the FETs should be prescribed considering such side etching. Accordingly, the conventional method has problems that the number of chips per wafer is small, and that a production efficiency is low.

In designing the chip as described above, it is important that the depth of the element isolating portion, as shown in part A5 in FIG. 6, should be designed so that the buffer layer made of undoped GaAs (5000 Å), undoped $Al_{0.2}Ga_{0.8}As$ (2000 Å), and undoped GaAs (1000 Å) is entirely removed in the corresponding area for the following reason. A specific resistance of the semi-insulating substrate is $10^7$ Ω cm or more, which is extremely high, while a specific resistance of the buffer layer is several or several tens Ω cm. When the element isolating portion is formed so as to reach the inside of the semi-insulating substrate having a high specific resistance, a conductivity between the FETs is sufficiently small so as to be negligible. Therefore, the current leakage can be effectively reduced and mutual interferences between the FETs do not substantially occur. Several tens of micrometers is sufficient for the length of element isolating portion, i.e., distance between the FETs in the direction horizontal to the semi-insulating substrate. When the FETs are arranged with such a distance therebetween, mutual interferences between the FETs do not substantially occur.

SUMMARY OF THE INVENTION

According to one aspect of the present invention, the semiconductor device includes two or more semiconductor elements provided on a semi-insulating substrate with a buffer layer and an interlevel film being interposed therebetween, an element isolating portion provided as a result of forming a groove between the two or more semiconductor elements through the buffer layer and the interlevel film so as to reach the semi-insulating substrate, and a protective film for protecting at least ends of the buffer layer in the vicinity of the element isolating portion.

In one embodiment of the present invention, the protective film is provided on the semi-insulating substrate at a bottom of the element isolating portion.

In another embodiment of the present invention, the buffer layer includes at least an AlGaAs layer.

In still another embodiment of the present invention, the semiconductor device further includes a scribe line portion provided as a result of forming a groove through the buffer layer and the interlevel film so as to reach the semi-insulating substrate.

In still another embodiment of the present invention, a width of an opening of the interlevel film on the buffer layer is smaller than a width of an opening of the buffer layer in the vicinity of the element isolating portion.

In still another embodiment of the present invention, the protective film is provided in the scribe line portion and has an opening on at least a portion of a bottom of the scribe line portion.

In still another embodiment of the present invention, a width of an opening of the interlevel film on the buffer layer in the vicinity of the element isolating portion is smaller than a width of an opening of the interlevel film in the vicinity of the scribe line portion.

In still another embodiment of the present invention, the scribe line portion is provided so as to surround the two or more semiconductor elements, and the element isolating portion extends from one side to an opposite side of the scribe line portion.

According to another aspect of the present invention, a method for fabricating a semiconductor device includes the steps of providing two or more semiconductor elements including an electrode on a semi-insulating substrate with the buffer layer and the interlevel film being interposed therebetween; forming an opening in the interlevel film at least between the semiconductor elements; and forming a groove through the buffer layer and the interlevel film so as to reach the semi-insulating substrate, between the semiconductor elements, utilizing the opening of the interlevel film, thereby forming an element isolating portion.

In one embodiment of the present invention, the buffer layer is etched by wet etching with an etchant including phosphoric acid, water and hydrogen peroxide at a volume ratio of phosphoric acid to water of 4:10 to 30.

In another embodiment of the present invention, the method for fabricating a semiconductor device, after the step of forming the groove, further includes the step of forming a protective film for protecting at least a side surface of the groove.

In still another embodiment of the present invention, the opening in the interlevel film is also formed at a region surrounding the elements, and the method further includes the step of forming a groove at the region through the buffer layer and the interlevel film so as to reach the semi-insulating substrate and to surround the semiconductor elements, thereby f6rming a scribe line portion.

In still another embodiment of the present invention, the step of forming the opening of the interlevel film and the step of forming the groove between the semiconductor elements are performed with an identical resist.

In still another embodiment of the present invention, the method for fabricating a semiconductor device further includes the steps of forming a protective film on a bottom of the grooves in the element isolating portion and the scribe line portion, and forming an opening in at least a portion of the protective film on the bottom of the groove in the scribe line portion.

In still another embodiment of the present invention, the step of forming the opening in at least the portion of the protective film is performed by etching using a mask, and the step also forms a opening on the electrode of the semiconductor element by etching using the same mask.

According to still another aspect of the present invention, a method for fabricating a semiconductor device includes the steps of providing two or more semiconductor elements including an electrode on a semi-insulating substrate with a buffer layer and an interlevel film being interposed therebetween; forming an opening in the interlevel film at least between the semiconductor elements; and forming an ion implantation layer through the buffer layer and so as to reach the semi-insulating substrate between the semiconductor elements, utilizing the opening of the interlevel film, thereby forming an element isolating portion.

In one embodiment of the present invention, the opening in the interlevel film is also formed at a region surrounding the elements, and the method further includes the step of forming an ion implantation layer through the buffer layer so as to reach the semi-insulating substrate and to surround the semiconductor elements, thereby forming a scribe line portion.

In another embodiment of the present invention, an element implanted for forming the ion implantation layer is selected from the group consisting of proton, boron and oxygen.

In still another embodiment of the present invention, the method for fabricating a semiconductor device further includes the step of forming a protective film at least on the ion implantation layer after the step of forming the ion implantation layer.

In still another embodiment of the present invention, the method for fabricating a semiconductor device further includes the step of forming an opening in at least a portion of the protective film on the ion implantation layer of the scribe line portion.

Thus, the invention described herein makes possible the advantages of (1) providing a semiconductor device and a method for fabricating the same, capable of reducing a current leakage due to impurities adsorbing to and oxidation of a surface of a buffer layer exposed to outside air in a fewer number of steps so as to improve electric characteristics, and (2) providing a semiconductor device having an improved production efficiency and a method for fabricating the same, capable of increasing the number of chips per wafer by reducing a distance between FETs, i.e., the length of an element isolating portion.

These and other advantages of the present invention will become apparent to those skilled in the art upon reading and understanding the following detailed description with reference to the accompanying figures.

BRIEF DESCRIPTION OF THE DRAWINGS

FIGS. 2A to 2G are cross-sectional views showing steps of fabricating a FET in the semiconductor device shown in FIG. 1A;

FIG. 3 shows cross-sectional views illustrating steps of forming an element isolating portion and a scribe line portion in the semiconductor device in example 1;

DESCRIPTION OF THE PREFERRED EMBODIMENTS

Figure 1A:
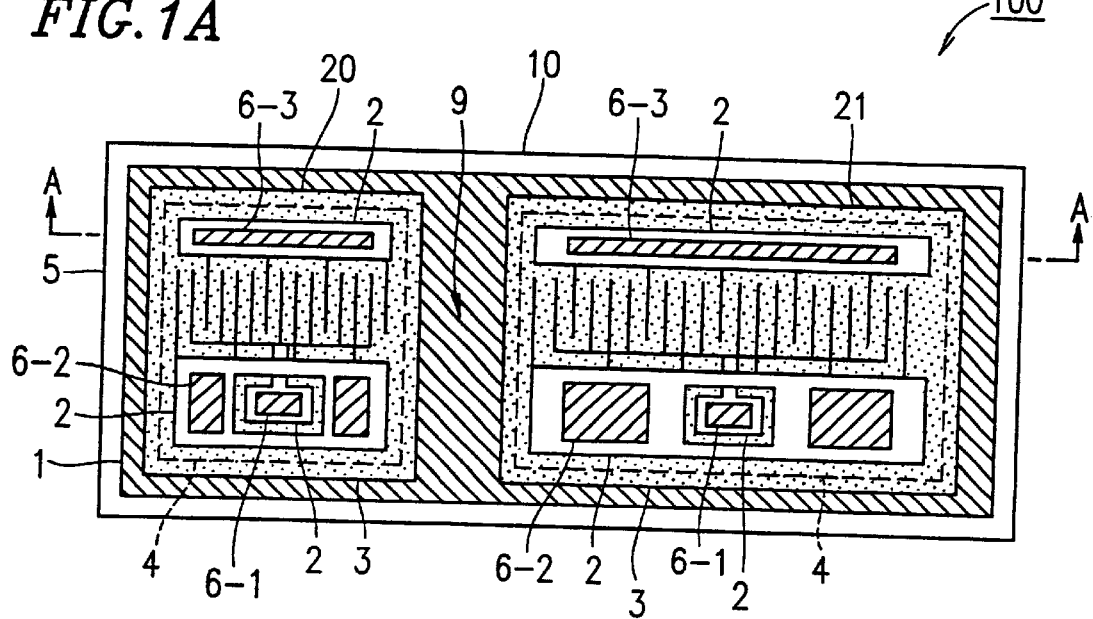
FIG. 1A is a schematic plan view of a semiconductor device according to a example 1 of the present invention.

Hereinafter, the present invention will be described by way of illustrative examples with reference to the accompanying drawings in which the same reference numerals designate the same components.

Example 1

Figure 1B:
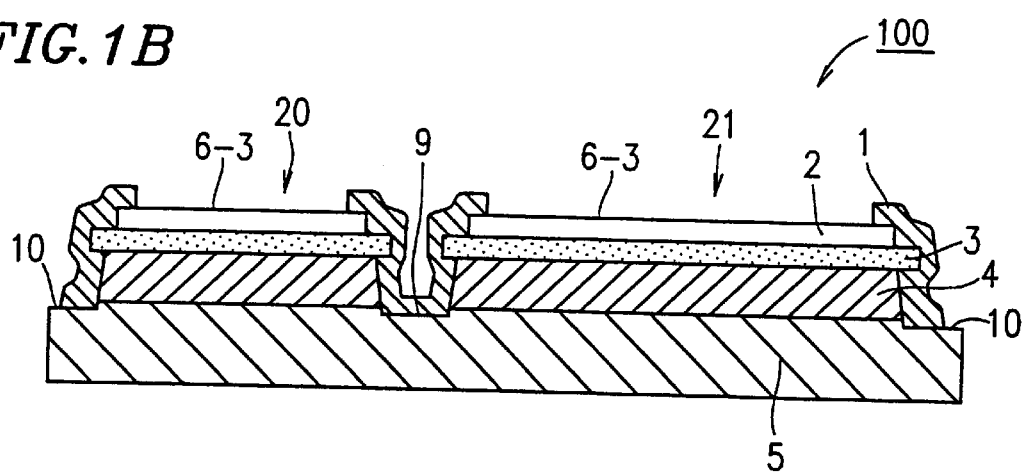
FIG. 1B is a cross-sectional view of the semiconductor device according to the example 1 of the present invention taken along line A—A in FIG. 1A.

FIGS. 1A and 1B show a semiconductor device (chip) 100 fabricated in accordance with example 1 of the present invention. FIG. 1A is a plan view of the semiconductor device 100. FIG. 1B is a cross-sectional view of the semiconductor device 100 taken along line A—A of FIG. 1A.

FIGS. 2A to 2F are cross-sectional views showing steps of fabricating a FET (semiconductor element) in the semiconductor device 100. FIG. 3 shows cross-sectional views illustrating a method for forming an element isolating portion 9 and a scribe line portion 10 of the semiconductor device 100 in example 1. In FIG. 3, parts A1 to A5 show steps of forming an element isolating portion 9, and parts B1 to B5 show steps of forming a scribe line portion 10. Parts A1, A2, A3, A4 and A5 and parts B1, B2, B3, B4 and B5 show corresponding steps, respectively.

As shown in FIGS. 1A and 1B, the semiconductor device 100 includes two FETs 20 and 21 adjacent to each other. The element isolating portion 9 between the FETs 20 and 21, and the scribe line portion 10 formed as a result of scribing a semi-insulating substrate 5 so as to surround the FETs 20 and 21 are provided on the semi-insulating layer 5.

Furthermore, with reference to parts A5 and B5 in FIG. 3, the semiconductor device 100 includes the semi-insulating layer 5; a buffer layer 4 provided on the semi-insulating layer 5; an interlevel film 3 provided on the buffer layer 4; an electrode 2 provided on the interlevel film 3; a protective film 1 provided on the semi-insulating layer 5 covering ends of the electrode 2, the interlevel film 3, and the buffer layer 4, and formed so that a top surface of the electrode 2 is partially exposed so as to form electrode windows 6. As shown in FIGS. 1A and 1B, the electrode windows 6 include a gate electrode window 6-1, a source electrode window 6-2, and a drain electrode window 6-3.

Figure 6:
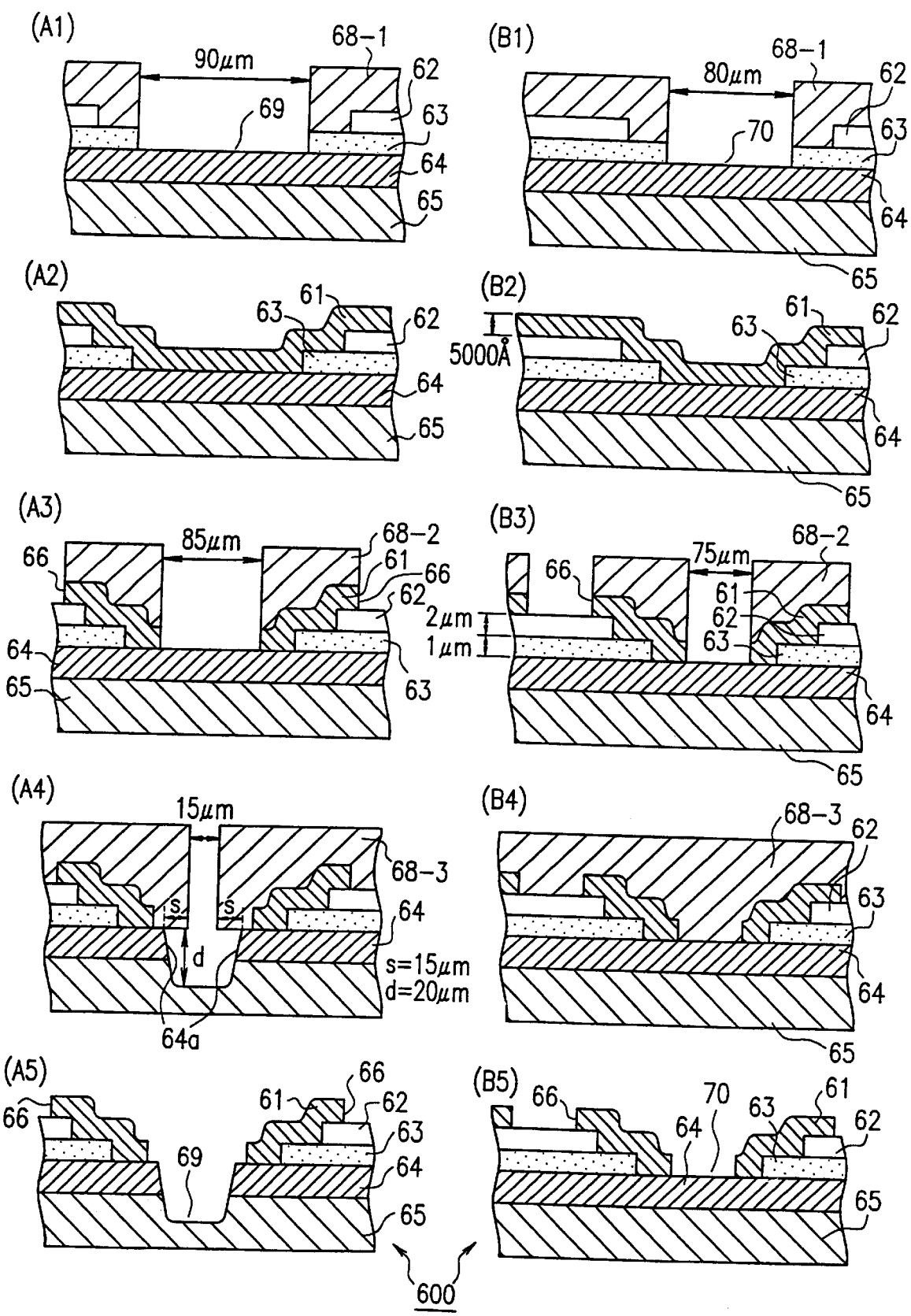
FIG. 6 shows steps of fabricating a conventional semiconductor device.

Regarding parts A5 and B5 in FIG. 6, the semi-insulating substrate 5 is made of GaAs, and the buffer layer 4 is made of AlGaAs. The interlevel film 3 includes an upper layer made of SiN having at thickness of 5000 Å and a lower layer made of $SiO_2$ having a thickness of 5000 Å. The electrode 2 is made of an Au layer having a thickness of 2 μm, and the protective film 1 is made of a SiN layer having a thickness of 5000 Å. As shown in part A5 in FIG. 3, the semiconductor device 100 has the element isolating portion 9 penetrating the buffer layer 4 and reaching the inside of the semi-insulating substrate 5. In the vicinity of the element isolating portion 9, the buffer layer 4 and the semi-insulating substrate 5 are covered with the protective film 1. Furthermore, as shown in part B5 in FIG. 3, the protective film 1 is partially disconnected on the semi-insulating substrate 5 so as to form the scribe line portion 10. In the vicinity of the scribe line portion 10, the buffer layer 4 is covered with the protective film 1.

Hereinafter, a method for fabricating the semi-conductor device 100 of example 1 will be described in detail.

Figure 2A:
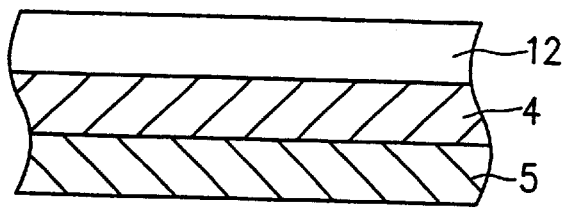
Figure 2B:
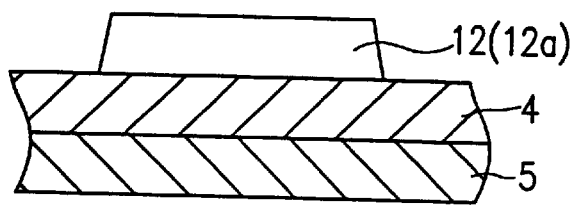
Figure 2C:
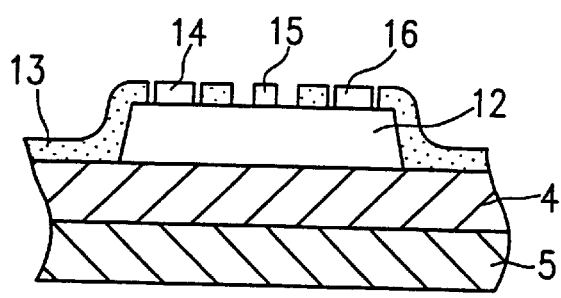
Figure 2D:
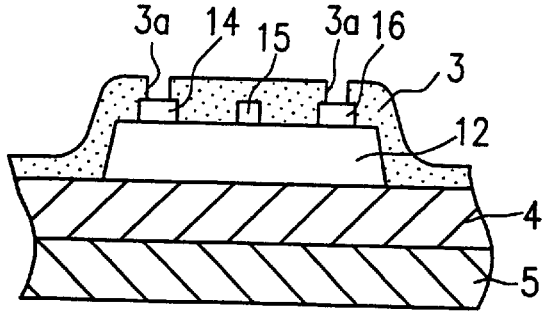
Figure 2E:
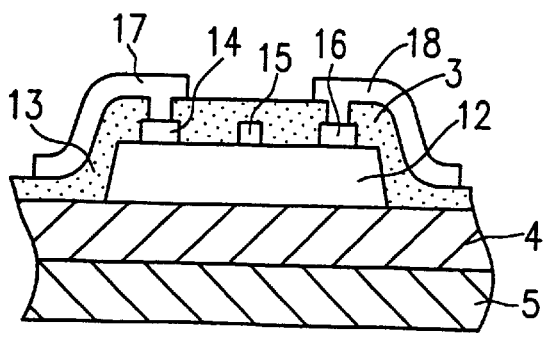

First, a method for fabricating FETs will be briefly described with reference to FIGS. 2A to 2F. As shown in FIG. 2A, a buffer layer 4 and an active layer 12 are formed on the semiconductor substrate 5. Thereafter, as shown in FIG. 2B, the active layer 12 is patterned as prescribed so as to be divided into separate active areas 12a (only one is shown in FIG. 2B) electrically insulated from each other. (Hereinafter, "the active area 12a" will be referred to simply as "the active layer 12".) Subsequently, as shown in FIG. 2C, a spacer 13 ($SiO_2$; thickness: about 3000 Å) is formed on the buffer layer 4 so as to cover the active layer 12. Using the spacer 13, a source metal layer 14, a gate metal layer 15, and a drain metal layer 16 are vapor-deposited on the active layer 12. Then, a $SiO_2$ film (thickness: about 2000 Å) and a SiN film (thickness: about 5000 Å) are deposited sequentially on the active layer 12 so as to cover the source metal layer 14, the gate metal layer 15 and a drain metal layer 16, thereby forming a passivation film. The interlevel film 3 includes the spacer 13 and the passivation film thereof as shown in FIG. 2D. Next, contact holes 3a penetrating the interlevel film 3 are formed so as to reach the source metal layer 14 and the drain metal layer 16. As shown in FIG. 2E, electrodes 17 and 18 electrically connected to the source metal layer 14 and the drain metal layer 16 are respectively formed in the shape of islands so as to fill the contact holes 3a. Thereafter, as shown in FIG. 2F, the resultant laminate is etched during one step of forming the element isolating portion 9 and the scribe line portion 10 as described below. Thus, FETs 20 and 21 (FIG. 1) are formed. Any appropriate method can be applied to fabrication of the FETs 20 and 21.

Hereinafter, a method for forming the element isolating portion 9 and the scribe line portion 10 between and around the FETs 20 and 21 so as to complete the semiconductor device 100 will be described in detail with reference to FIG. 3.

As shown in part A1 and B1 in FIG. 3, a first resist layer 7-1 used for etching the interlevel film 3 including a SiN (upper) layer (thickness: about 5000 Å) and a $SiO_2$. (lower) layer (thickness: about 5000 Å) is formed in a dark room by a resist coater. The first resist layer 7-1 is formed on a laminate including the semi-insulating substrate 5, the buffer layer 4, the interlevel film 3 and the Au electrode 2. The first resist layer 7-1 has an opening having a width of 15 μm at a position where the element isolating portion 9 will be formed and an opening having a width of 80 μm at a position where the scribe line portion 10 will be formed.

Next, the interlevel film 3 is etched at positions where the element isolating portion 9 and the scribe line portion 10 will be formed, resulting in a configuration shown in parts A1 and B1 in FIG. 3. In this step, the SiN layer is etched by dry etching with $CF_4$, and the $SiO_2$ layer is etched by wet etching using hydrof hydrofluoric acid. Thereafter, as shown in parts A2 and B2 in FIG. 3, the resultant laminate is etched from a top surface of the buffer layer 4 by wet etching using an etchant having a volume ratio of phosphoric acid to hydrogen peroxide to water of about 4:1:20. The buffer layer 4 and the semi-insulating substrate 5 are etched respectively by about 8000 Å and about 2000 Å (total depth d=about 1 μm) perpendicular to the surface of the semi-insulating substrate 5. As a result, a groove is formed at positions where the element isolating portion 9 and the scribe line portion 10 will be formed later. In this case, a length of the side etching is as short as s=about 0.75 μm.

The etching is preferably performed so that the groove reaches the surface of the semi-insulating substrate 5 and further removes a top portion of the semi-insulating substrate 5 (preferably about 1 μm to about a several angstroms in a direction perpendicular to the surface of the semi-insulating substrate 5). By performing etching in this manner, a current leakage occurring due to capacitance between the buffer layer 4 and the semi-insulating substrate 5 can be decreased. In this step, the depth of the etching has to be restricted not to generate a cleavage in the semiconductor insulating substrate 5 and/or not to increase a width, i.e., a length in a horizontal direction of the element isolating portion 9. The etchant used in the conventional method having a volume ratio of phosphoric acid to hydrogen peroxide to water of 4:1:5 provides a high etching rate (about 2 μm per minute), and so is not suitable for etching a depth of about 1 μm of the buffer layer 4 and the semi-insulating substrate 5. As described above, in example 1, the volume ratio of phosphoric acid to hydrogen peroxide to water of the etchant is about 4:1:20. In this case, the etching rate is about 0.3 μm per minute and is appropriate for controlling the depth of etching with high precision. According to the conventional method, as described above with reference to part A4 in FIG. 6, no matter how small the width of the opening of the third resist 68-3 (about 15 μm) is, the distance between FETs cannot be made equal to or less than the total width of the side etching (2s=about 30 μm). In contrast, in example 1, the first resist layer 7-1 only needs to be opened as wide as the minimum horizontal distance required between the FETs 20 and 21 for forming the element isolating portion 9. In example 1, the opening of the first resist 7-1 has a width of about 15 μm.

After removing the first resist layer 7-1, as shown in parts A3 and B3 in FIG. 3, a SiN layer is formed as the protective film 1 having a thickness of about 5000 Å. Since the length of the side etching is merely 0.75 μm as described above, the protective film 1 successfully covers a region exposed by the side etching.

As shown in parts A4 and B4 in FIG. 3, the second resist layer 7-2 used for forming the electrode windows 6 on the Au electrode 2 (corresponding to the above described electrodes 17 and 18) is formed on the resultant laminate by deposition in a dark room by a resist coater. As described above, the electrode windows 6 include the gate electrode window 6-1, the source electrode window 6-2, and the drain electrode window 6-3. The second resist layer 7-2 needs to be exposed and opened, preferably at one time, at positions where the electrode windows 6 and the scribe line portion 10 will be formed. Exposed surfaces of the protective film 1 are then etched using the second resist layer 7-2 as a mask. Bottom surfaces of the openings to be formed are not on the same level but stepped with respect to the semi-insulating substrate 5. However, as described above with reference to part A2 in FIG. 3, the buffer layer 4 and the semi-insulating substrate 5 are etched to a total depth of about 1 μm from the top surface of the buffer layer 4. Thus, the level difference between the bottoms of the openings to be formed is about 4 μm (i.e., about 2 μm (thickness of Au electrode 2), about 1 μm (thickness of interlevel film 3) and about 1 μm (etching depth d)), which is not much different from the level difference of about 3 μm (part B3 in FIG. 6) in the conventional method. Therefore, problems, such as a focal depth not being adjustable for exposing the second resist layer 7-2 to form the openings, do not occur. It is possible to form the openings in the second resist layer 7-2 under the same conditions as those of the conventional method.

Subsequently, as shown in parts A4 and B4 in Figure 3, the protective film 1 is etched by dry etching with $CF_4$. The second resist layer 7-2 is removed, resulting in a configuration shown in parts A5 and B5 in FIG. 3. As a result, the semiconductor device 100 having the element isolating portion 9 and the scribe line portion 10 is produced as shown in FIG. 2G.

In the semiconductor device 100 fabricated in the above-described manner, a width of an opening of the interlevel film 3 is narrower than that of the buffer layer 4 in the vicinity of the element isolating portion 9, so that the interlevel film 3 is protruding over the buffer layer 4. Therefore, a current leakage from the electrode 2 through interlevel film 3 to the buffer layer 4 and/or an electric connection between the electrode 2 and the buffer layer 4 due to a surface contamination or a surface oxidation of the buffer layer 4 are reduced.

Figure 4:
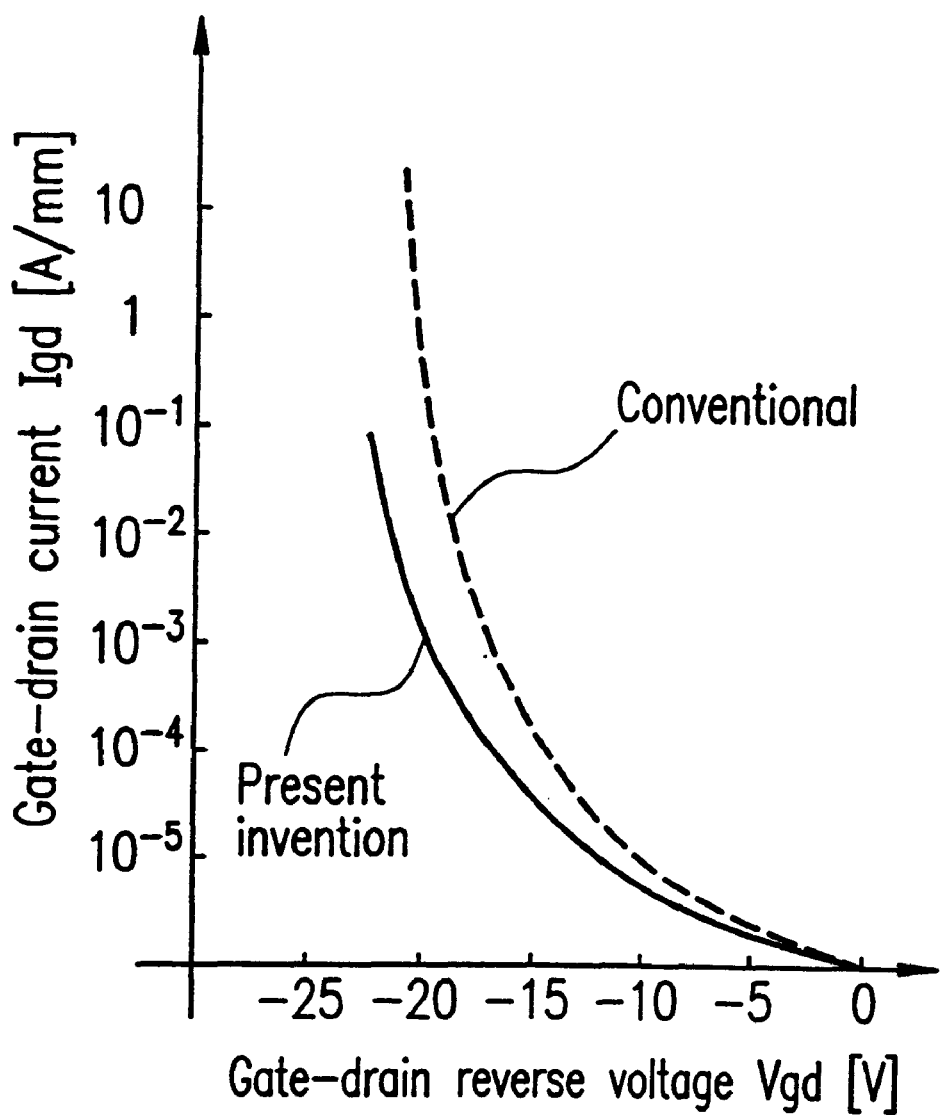
FIG. 4 is a graph showing the relationship of a reverse voltage Vgd and a current Igd between a gate and a drain of the semiconductor device in example 1.

FIG. 4 is a graph showing the relationship between a reverse voltage Vgd and a current Igd between a gate and a drain in the semiconductor device 100 of example 1 (solid line), which is based on the measurement result of the current leakage. For comparison, the relationship between a reverse voltage Vgd and a current Igd between a gate and a drain in the semiconductor device 600 fabricated in the conventional method described above with reference to FIG. 6 is shown by the broken line. As apparent from FIG. 4, when Vdg of −20 V is applied on the semiconductor devices, the Igd of the semiconductor device 100 is about $10^{-3}$ A/mm while that of the conventional semiconductor device 600 is about $10^{-1}$ A/mm. In other words, in the semiconductor device 100 of example 1, the current leakage between the FETs is reduced to about 1% of that of the conventional semiconductor device 600.

The method of fabricating the semiconductor device 100 of example 1 requires, after making FETs 20 and 21, two steps of forming resist layers in a dark room before forming the element isolating portion 9 and the scribe line portion 10 while the conventional method requires three steps. Therefore, the method in example 1 requires less steps than the conventional method. Moreover, as shown in parts A5 and B5 in FIG. 3, the buffer layer 4 is covered with the protective film 1 both in the vicinity of the element isolating portion 9 and the scribe line portion 10, and so the buffer layer 4 is not exposed to outside air, thus resulting in being free from oxidation. Therefore, causes of the current leakage in a channel region through the buffer layer 4 are eliminated. In addition, when determining the distance between the FETs 20 and 21, side etching caused by etching for forming the element isolating portion 9 is substantially negligible. While the FETs of the conventional semiconductor device 600 should be arranged apart from each other by a distance of about 30 μm, the distance between FETs can be significantly reduced in the semiconductor device 100. Therefore, the number of chips per wafer can be significantly increased in example 1 compared to that obtained by the conventional method. Furthermore, in the semiconductor device 100 of example 1, since the element isolating portion 9 is formed between FETs 20 and 21, and the protective film 1 is provided so as to surround the FETs 20 and 21, as shown in FIGS. 1A and 1B, more effective element protection and element isolation can be obtained than in the conventional semiconductor device 600.

Example 2

Figure 5:
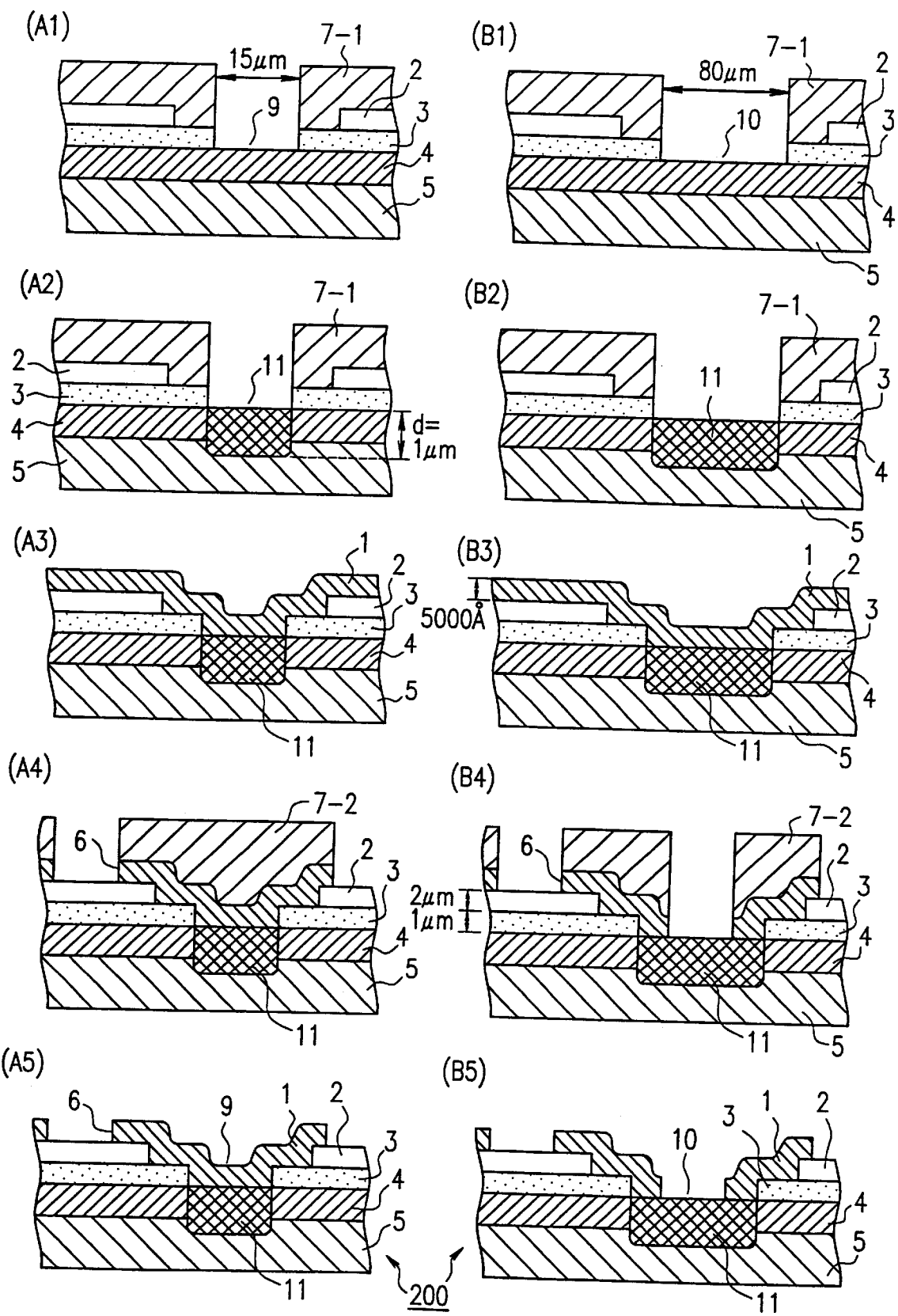
FIG. 5 shows steps of forming an element isolating portion and a scribe line portion in a semiconductor device in example 2 according to the present invention.

FIG. 5 shows cross-sectional views illustrating steps of forming an element isolating portion 9 between two FETs and a scribe line portion 10 around the FETs so as to produce a semiconductor device 200 in example 2 according to the present invention. In FIG. 5, parts A1 to A5 show steps of forming the element isolating portion 9, and parts B1 to B5 show steps of forming the scribe line portion 10. Parts A1, A2, A3, A4 and A5 and parts B1, B2, B3, B4 and B5 show corresponding steps, respectively.

A structure of the semiconductor device 200 of example 2 is almost the same as that of the semiconductor device 100 of example 1. As shown in parts A5 and B5 in FIG. 5, the semiconductor device 200 further includes an ion implantation layer 11 provided under the element isolating portion 9 and the scribe line portion 10. A protective film 1 is provided on the ion implantation layer 11, covering ends of an electrode 2 and an interlevel layer 3. The ion implantation layer 11 penetrates the buffer layer 4 reaching an inside of a semi-insulating substrate 5.

Hereinafter, a method for fabricating the semi-conductor device 200 of example 2 will be described in detail.

First, FETs (semiconductor element) are fabricated as shown in the FIG. 2F by the same method as described in example 1. Any appropriate method can be employed in fabricating the FETs. The first resist layer 7-1 (parts A1 and B1 in FIG. 5) used for etching the interlevel film 3 including a SiN (upper) layer (thickness: about 5000 Å) and a SiO$_2$ (lower) layer (thickness: about 5000 Å) is formed in a dark room by a resist coater. The first resist layer 7-1 has an opening having a width of 15 μm at a position where the element isolating portion 9 will be formed and an opening having a width of about 80 μm at a position where the scribe line portion 10 will be formed.

Next, still referring to A1 and B1 in FIG. 5, the interlevel film 3 is etched at positions where the element isolating portion 9 and the scribe line portion 10 will be formed. In this step, the SiN layer is etched by dry etching with CF$_4$, thereafter the SiO$_2$ layer is etched by wet etching with hydrofluoric acid. As shown in parts A2 and B2 in FIG. 5, the ion implantation layer 11 used for insulating the FETs from each other is formed using the first resist layer 7-1 as a mask, by ion implantation with boron on the conditions that the accelerating energy is about 120 keV and the dose is about $1 \times 10^{13}$ cm$^{-2}$. Boron can be replaced with oxygen (O$^+$) or proton(H$^+$).

Thereafter, as shown in parts A3 and B3 in FIG. 5, a SiN layer is grown by plasma CVD on the ion implantation layer 11 so as to cover the electrode 2 and the interlevel layer 3. As a result, the protective film 1 having a thickness of 5000 Å covering the entire surface of the resultant laminate is obtained. Then, as shown in parts A4 and B4 in FIG. 5, the protective film 1 is etched by dry etching with CF$_4$ using a second resist layer 7-2 as a mask, so as to form an electrode window 6 and the scribe line portion 10. Then, the second resist layer 7-2 is removed by a resist remover. As a result, the semiconductor device 200 having the element isolating portion 9 and the scribe line portion 10 is produced as shown in parts A5 and B5 in FIG. 5.

By the method in example 2, the number of steps of forming resist layers in a dark room between the steps of making FETs and the steps of forming the element isolating portion 9 and the scribe line portion 10 is reduced as in example 1. Furthermore, as shown in parts A5 and B5 in FIG. 5, since the buffer layer 4 is covered with the ion implantation layer 11 in the vicinity of the element isolating portion 9 and the scribe line portion 10 without being exposed to outside air, the above-described problems such as a current leakage or the like can be alleviated.

According to the present invention, as described above, the number of steps of forming resist layers in a dark room for fabricating the semiconductor device is smaller than that required by the conventional method. Furthermore, since the buffer layer is covered with a protective layer in the vicinity of the element isolating portion and the scribe line portion, problems such as a current leakage or the like can be alleviated. Moreover, since side etching does not substantially occur in etching steps for forming the element isolating portion, the number of chips which can be produced per wafer can be increased. Therefore, a production efficiency can be improved.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor device, comprising:

a buffer layer formed on a semi-insulating substrate;

a plurality of semiconductor elements including a plurality of active areas separately disposed on the buffer layer, and an interlevel film which separately covers the plurality of active areas and the buffer layer around each active area;

an element isolating portion provided as a result of forming a groove between the plurality of active areas so as to reach from an opening of the buffer layer and an opening of the interlevel film to the semi-insulating substrate, a width of the opening of the buffer layer being larger than a width of the opening of the interlevel film; and a protective film formed so as to cover at least ends of the buffer layer in the vicinity of the opening thereof.

2. A semiconductor device according to claim 1, wherein the protective film is formed so as to cover the semi-insulating substrate at a bottom surface of the element isolating portion.

3. A semiconductor device according to claim 1, wherein the buffer layer includes at least an AlGaAs layer.

* * * * *